(12) United States Patent  
Nagai (10) Patent No.: US 8,546,866 B2  
(45) Date of Patent: Oct. 1, 2013

(54) NONVOLATILE SEMICONDUCTOR MEMORY DEVICE CAPABLE OF PREVENTING A SILICIDE SHORT

(75) Inventor: Takaaki Nagai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 328 days.

(21) Appl. No.: 12/876,376

(22) Filed: Sep. 7, 2010

(65) Prior Publication Data

US 2011/0057245 A1    Mar. 10, 2011

(30) Foreign Application Priority Data

Sep. 10, 2009    (JP) ................................ 2009-209071

(51) Int. Cl.  
*H01L 29/788*    (2006.01)

(52) U.S. Cl.  
USPC ................................ 257/316; 257/E29.309

(58) Field of Classification Search  
USPC .............. 257/316, E21.209, E29.3, 314, 315, 257/317, 319, 324, E29.309, E21.21, E21.679, 257/E27.103, E29.128  
See application file for complete search history.

(56) References Cited

U.S. PATENT DOCUMENTS

| 2003/0143792 A1* | 7/2003 | Satoh et al. .................. 438/197 |
| 2007/0207581 A1* | 9/2007 | Yasui et al. .................. 438/257 |
| 2009/0090962 A1* | 4/2009 | Kikuchi ....................... 257/324 |

FOREIGN PATENT DOCUMENTS

JP    2002-231829    8/2002

* cited by examiner

*Primary Examiner* — Selim Ahmed  
(74) *Attorney, Agent, or Firm* — Young & Thompson (57) ABSTRACT

A nonvolatile semiconductor memory device according to an exemplary embodiment of the present invention including, a first gate electrode formed above a semiconductor substrate via a first insulating film, having a projecting part which projects in upper direction with a certain width; a second gate electrode formed beside a side surface of the first gate electrode via a second insulating film; two side walls having insulation properties formed on a side surface of the second gate electrode and a side surface of the projecting part respectively; and a silicide layer formed on an upper surface of the projecting part and a part of a surface of the second gate electrode, wherein a width of the projecting part is smaller than a width of the first gate electrode below the projecting part.

5 Claims, 9 Drawing Sheets

WRITING

Fig. 2B

DELETING

Fig. 2C

READING

WRITING

Fig. 5B

DELETING

Fig. 5C

READING

NONVOLATILE SEMICONDUCTOR MEMORY DEVICE CAPABLE OF PREVENTING A SILICIDE SHORT

INCORPORATION BY REFERENCE

This application is based upon and claims the benefit of priority from Japanese patent application No. 2009-209071, filed on Sep. 10, 2009, the disclosure of which is incorporated herein in its entirety by reference.

BACKGROUND

1. Field of the Invention

The present invention relates to a nonvolatile semiconductor memory device and a manufacturing method thereof.

2. Description of Related Art

Among nonvolatile semiconductor memory devices capable of programming/erasing electrically, a split gate type memory cell structure, a control gate of which is formed above a side wall of a word gate via a insulating film, as represented by the MONOS (Metal-Oxide-Nitride-Oxide-Silicon) structure is known. The word gate and the control gate are typically made of poly silicon, so each surface is alloyed (silicided) to reduce wiring resistance substantively for improving conductivity.

In the split gate type MONOS memory having such configuration, the word gate and the control gate are insulated from each other via an only thin ONO (Oxide Nitride Oxide) film. Therefore, a silicide formed on the surface of the word gate and a silicide formed on the surface of the control gate short, thereby often causing a silicide short.

Thus, if the silicide short is occurred in the early stages, there is a problem that a yield is lowered by an initial failure. Further, if the separation of silicides is insufficient even if the silicide short is not occurred in the early stages, a short failure is occurred by applying a bias repeatedly in program/erase cycles, so there is a problem with reliability.

With respect to these problems, Japanese Unexamined Patent Application Publication No. 2002-231839 (Ogura et al.) discloses a technique to prevent the silicide short between the control gate and the word gate by forming the control gate with lower height than the word gate. Ogura et al. discloses that the height of the word gate is 2000 to 2500 Å and the height of the control gate is 1000 to 1250 Å.

SUMMARY

However, in the technique disclosed by Ogura et al., the difference in height between the word gate and the control gate need to be large enough to have a sufficient margin for the silicide short between the word gate and the control gate.

If the height of the control gate is lowered excessively to make the difference larger, unnecessary impurities may penetrate the control gate to be injected into a channel region during the ion implantation to form a diffusion layer as a source/drain region. Further, there is a concern that the long-term reliability is decreased by deterioration of a gate insulating film because impurities also penetrate the insulating film on this occasion.

Meanwhile, if the height of the word gate is heightened excessively, the thickness of an interlayer insulating film formed thereon need to be thicker, so it is difficult to form a contact with the diffusion layer. Further, there is a problem that a resist mask which is used during the etching of the word gate cannot withstand the dry etching.

A exemplary aspect of an embodiment of the present invention is a nonvolatile semiconductor memory device including, a first gate electrode formed above a semiconductor substrate via a first insulating film, having a projecting part which projects in upper direction with a certain width; a second gate electrode formed beside a side surface of the first gate electrode via a second insulating film; two side walls having insulation properties formed on a side surface of the second gate electrode and a side surface of the projecting part respectively; and a silicide layer formed on an upper surface of the projecting part and a part of a surface of the second gate electrode, wherein a width of the projecting part is smaller than a width of the first gate electrode below the projecting part. According to this configuration, the width between the silicide layer on the word gate and the silicide layer on the control gate can be increased in the direction in which the word gate and the control gate are neighbored.

A exemplary aspect of an embodiment of the present invention is a manufacturing method of a nonvolatile semiconductor memory device including, forming a first gate electrode having a projecting part which projects in upper direction with a certain width above the semiconductor substrate via a first insulating film; forming a second gate electrode beside a side surface of the first gate electrode via a second insulating film; forming two side walls having insulation properties on a side surface of the second gate electrode and the side surface of the projecting part respectively; and forming a silicide layer on an upper surface of the projecting part and a part of a surface of the second gate electrode. According to this method, the width between the silicide layer on the word gate and the silicide layer on the control gate can be increased in the direction in which the word gate and the control gate are neighbored.

According to an exemplary aspect of the present invention, it is possible to provide a nonvolatile semiconductor memory device and a manufacturing method thereof capable of preventing the silicide short without making the difference in height between the word gate and the control gate larger.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Referring to the drawings, exemplary embodiments of the present invention are explained hereinafter. In the following descriptions and the drawings, some nonessential parts are omitted or simplified as appropriate in order to make the explanations clearer and easier. Further, redundant explanations are omitted as necessary in order to make the explanations clearer and easier. The same components in each drawing are denoted by the same reference numerals, and the description thereof is omitted as appropriate.

First Exemplary Embodiment

Figure 1:
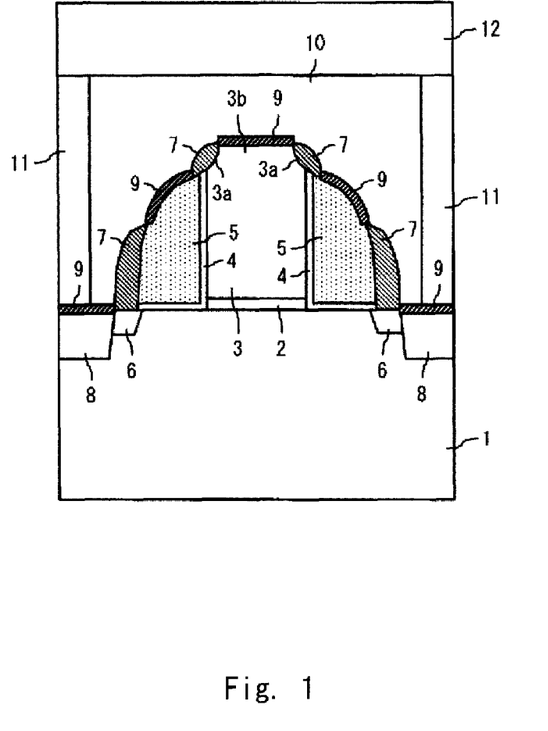
FIG. 1 is a cross-sectional view illustrating a configuration of a nonvolatile semiconductor memory device according to a first exemplary embodiment.

The configuration of a nonvolatile semiconductor memory device according to the first exemplary embodiment is described with reference to FIG. 1. FIG. 1 is a cross-sectional view illustrating a configuration of a nonvolatile semiconductor memory device according to the first exemplary embodiment. The nonvolatile semiconductor memory device according to this exemplary embodiment is a memory having a twin MONOS structure which a control gate 5 is formed both sides of a word gate 3.

In FIG. 1, a pair of diffusion layer 8 is provided in a main surface of a semiconductor substrate 1 as a source/drain region. The diffusion layer 8 is an n-type impurity region including such as arsenic and is formed in the surface region of the semiconductor substrate 1. A region between the pair of diffusion layer 8 is a channel region in which a channel is formed. LDD (Lightly Doped Drain) regions 6 which include an impurity at lower density than the diffusion layer 8 are provided between the channel region and each diffusion layer 8 respectively.

The word gate (a selected gate electrode, a first gate electrode) 3 and the control gate (a control gate electrode, a second gate electrode) 5 that is made of polysilicon or the like are provided above the channel region of the semiconductor substrate 1.

More specifically, the word gate 3 is formed above the surface of the channel region of the semiconductor substrate 1 via a gate insulating film (a first insulating film) 2. The gate insulating film 2 is an insulating film made of such as silicon oxide and has a film thickness of 2 to 4 nm. In this exemplary embodiment, truncated parts 3a are formed at corners of an upper surface of the word gate 3. Thus, the word gate 3 has such a cross-sectional shape that corners of the upper substantially rectangular shape is truncated and is rounded off in cross sectional view of FIG. 1. In other words, the word gate 3 has a projecting part 3b which projects in upper direction with a certain width.

To be more specific, the word gate 3 dents in the ends of the upper side thereof. The dent portions are truncated parts 3a. The part between truncated parts 3a is the projecting part 3b. The width of the projecting part 3b is smaller than that of the part lower than the projecting part 3b of the word gate 3. Therefore, an upper part, projecting part 3b, of an edge face (a side surface, a side wall face) of the word gate 3 is retreated inward of a pattern. As described, the truncated part 3a, the height of which is lower than the projecting part 3b, is formed at an outside part of the upper surface of the projecting part 3b of the word gate 3.

Here, the projecting part 3b is gradually expanded from the upper part to the lower part. At the lower part of the projecting part 3b, the width of the projecting part 3b is substantially equal to that of the word gate 3 below the projecting part 3b. Consequently, the edge face of the word gate 3 is retreated inward of the pattern at the lower part of the projecting part 3b. Additionally, it is gradually retreated inward of the pattern from the lower part to the upper part of the projecting part 3b. For example, as shown in FIG. 1, the word gate 3 can be formed in such a shape that the end of the upper part is truncated in a curved line in cross sectional view.

The word gate 3 is, for example, made of polysilicon film having a film thickness of 200 to 300 nm. Note that it is preferable to determine the thickness of the projecting part 3b as appropriate considering the width of the upper surface of the projecting part 3b, the thickness of the word gate 3 below the projecting part 3b or the like. Preferably, the thickness of the projecting part 3b is about 10 to 15% of the overall thickness of the word gate 3. Thus, if the overall thickness of the word gate 3 is 200 to 300 nm, the projecting part 3b is preferably formed in the thickness of 20 to 40 nm.

Further, control gates 5 are formed in the side wall shape beside the side wall surfaces of the word gate 3 on each diffusion layer 8 sides via an ONO film (a second insulating film) 4. In this exemplary embodiment, control gates 5 are provided adjacent to the side surface of the word gate 3 below the projecting part 3b via the ONO film 4. In other words, the height of the control gate 5 is lower than that of the word gate 3 to provide the control gate 5 at the position lower than the truncated part 3a and the projecting part 3b of the word gate 3. For example, the control gate 5 is made of a polysilicon film or an amorphous silicon film to which an impurity such as phosphorus is doped.

The control gate 5 is provided above the surface of the channel region of the semiconductor substrate 1 via the ONO film (the second insulating film) 4. Consequently, the ONO film 4 is formed between the control gate 5 and the word gate 3, and between the control gate 5 and the semiconductor substrate 1. The ONO film 4 is a three-layer laminated film that a silicon oxide ($SiO_2$) film, a silicon nitride ($Si_3N_4$) film, and a silicon oxide ($SiO_2$) film are laminated in this order. The silicon nitride film among the three layers that make up the ONO film 4 is a trapping insulating film with a property of storing charge. For example, the laminated film that a silicon oxide film with a film thickness of 6 nm, a silicon nitride film with a film thickness of 10 nm and a silicon oxide film with a film thickness of 4 nm are laminated in this order is formed as the ONO film 4.

Side walls 7 of insulation are formed on the side of the control gate 5 and the word gate 3 in the side wall shape. The side wall 7 is, for example, made of a monolayer film of silicon oxide, or a laminated film of silicon oxide, silicon nitride and silicon oxide. Here, the side wall 7 on the side of the control gate 5 is formed on the LDD region 6.

On the other hand, the side wall 7 on the side of the word gate 3 is formed to cover continuously at least the region from the side surface of the projecting part 3b to the end of the word gate 3 adjacent to the ONO film 4 (that is, the surface of the truncated part 3a). Consequently, the region of the word gate 3 uncovered with the ONO film 4 out of the surface of the word gate 3 except the upper surface of the projecting part 3b is covered with the side wall 7. Therefore, the surface of the word gate 3 above the control gate 5 is covered with the side wall 7 except the upper surface of the projecting part 3b. It is possible to prevent that a silicide described below shorts between the word gate and the control gate by the side wall 7.

Note, the side wall 7 on the side of the word gate 3 preferably extends from the end of the word gate 3 to the upside of the control gate 5 through the ONO film 4. That is, it is preferable that the side wall 7 is formed continuously over the region from the side of the projecting part 3b to the upside of the control gate 5 through the end of the word gate 3 and the ONO film 4, and extends from the word gate 3 to the control gate 5. Consequently, the silicide short is prevented greatly. Note that the side wall 7 that extends from the side of the word gate 3 is separated from the side wall 7 on the side of the control gate 5. In other words, the side wall 7 provided in the region including the side of the word gate 3 is provided away from the side wall 7 provided on the side of the control gate 5.

Further, silicide layers 9 for reducing wiring resistance are formed on the surface of the word gate 3 and the surface of the control gate 5. Specifically, the silicide layer 9 formed on the surface of the word gate 3 is provided on the projecting part 3b. On the other hand, the silicide layer 9 formed on the control gate 5 is provided on the region that is the part of the surface of the control gate 5, between the side wall 7 provided on the region including the side of the word gate 3 and the side wall 7 provided on the side of the control gate 5. The silicide layer 9 on the word gate 3 and silicide layer 9 on the control gate 5 are insulated each other without fault because the side wall 7 is provided therebetween.

In this exemplary embodiment, it is possible to form side walls 7 on truncated parts 3a of the word gate 3 by forming the word gate 3 in the shape having the projecting part 3b described above. So, silicide layers 9 on the word gate 3 and the control gate 5 are spaced with side walls 7 interposed therebetween. Thus, it is possible to insulate between silicide layers 9 without fault.

As described, a selected transistor which includes the word gate 3 and a non-selected transistor which includes the control gate 5 are formed in the nonvolatile semiconductor memory device according to the exemplary embodiment.

An interlayer insulating film 10 is formed on the semiconductor substrate 1 to cover these transistors. Silicide layers 9 and side walls 7 are covered with the interlayer insulating film 10. A contact 11 to connect electrically to the diffusion layer 8 is formed in the interlayer insulating film 10. In other words, metal such as tungsten is buried within a contact hole which penetrates the interlayer insulating film 10 on the diffusion layer 8. This is the contact 11 to connect to the silicide layer 9 on the diffusion layer 8.

A wiring (a bit line) 12 connected electrically to the diffusion layer 8 through the contact 11 is formed on the interlayer insulating film 10. The wiring 12 is made of a conductive film such as aluminum for example.

Figure 2A:
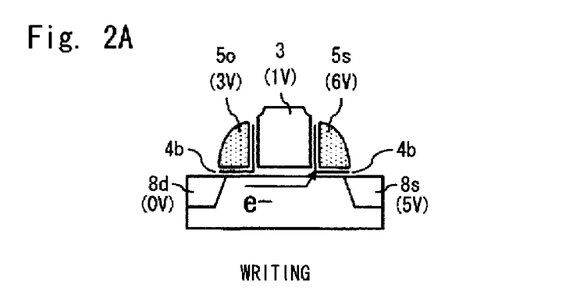
FIGS. 2A to 2C are schematic cross-sectional views illustrating an example of conditions for applying voltages to parts of the nonvolatile semiconductor memory device according to the first exemplary embodiment.
Figure 2B:
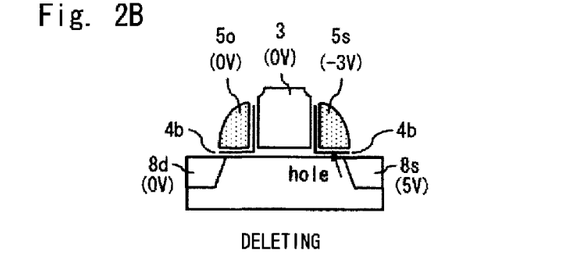
Figure 2C:
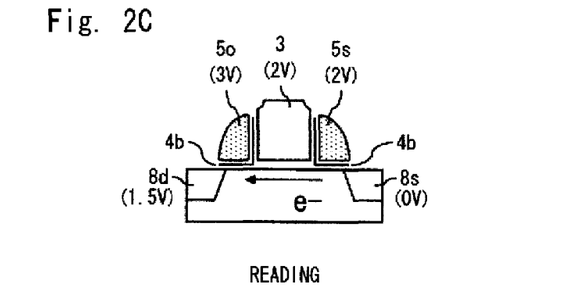

Next, the operation of the nonvolatile semiconductor memory device according to the exemplary embodiment is described with reference to FIGS. 2A to 2C. FIGS. 2A to 2C are schematic cross-sectional views illustrating an example of conditions for applying voltages to parts of the nonvolatile semiconductor memory device according to the first exemplary embodiment. FIG. 2A shows a condition for applying voltages in 'programming', FIG. 2B shows that in 'erasing', and FIG. 2C shows that in 'reading', respectively. Note, the conditions for applying voltages shown in FIGS. 2A to 2C are an example, and they are not limited to the above example. The conditions for applying voltages can be modified in various manners as appropriate. Note, in this exemplary embodiment, the injection of electrons to the silicon nitride film 4b, a charge storage part of the ONO film 4 of the memory transistor, is defined as 'programming', and the injection of holes is defined as 'erasing'.

Hereinafter, the control gate 5 which performs programming, erasing or reading is called as a selected control gate 5s, and the control gate 5 which becomes paired with the selected control gate 5s and does not perform programming, erasing or reading is called as a non-selected control gate 5o. It is assumed that the diffusion layer 8 provided on the side of the selected control gate 5s is a source region 8s and the diffusion layer 8 provided on the side of the non-selected control gate 5o is a drain region 8d.

The hot electron programming, as they called, is used as the programming method. For example, voltages as shown in FIG. 2A are applied to parts of the nonvolatile semiconductor memory device to perform programming. Specifically, for example, 1 V is applied to the word gate 3, 6 V is applied to the selected control gate 5s, 3 V is applied to the non-selected control gate 5o, 0 V is applied to the drain region 8d, and 5 V is applied to the source region 8s. Consequently, hot electrons are generated in the channel region between the source region 8s and the drain region 8d and hot electrons are locally injected into the region of the ONO film 4 under the selected control gate 5s on the side of the word gate 3. Injected hot electrons are caught in the trap in the silicon nitride film 4b in the ONO film 4. Accordingly, the threshold voltage Vth of the memory transistor including the selected control gate 5s rises.

The BTBT (Band-To-Band Tunneling) hot holes injection erasing method is used as the erasing method. More specifically, erasing is performed by injecting holes generated by BTBT to a charge storage part. For example, voltages as shown in FIG. 2B are applied to parts of the nonvolatile semiconductor memory device to perform erasing. Specifically, for example, 0 V is applied to the word gate 3, −3 V is applied to the selected control gate 5s, 0 V is applied to the non-selected control gate 5o, 0 V is applied to the drain region 8d, and 5 V is applied to the source region 8s. Consequently, holes are injected into the silicon nitride film 4b in the ONO film 4 by generating the holes by BTBT phenomenon and accelerating by the electric field, and the threshold voltage Vth of the memory transistor including the selected control gate 5s falls thereby.

For example, voltages as shown in FIG. 2C are applied to parts of the nonvolatile semiconductor memory device to perform reading. Specifically, for example, 2 V is applied to the word gate 3, 2 V is applied to the selected control gate 5s, 3 V is applied to the non-selected control gate 5o, 1.5 V is applied to the drain region 8d, and 0 V is applied to the source region 8s. It is possible to distinguish between the written state and the erased state by adjusting the voltage applied to the selected control gate 5s in reading to be between the threshold voltage Vth in programming and the threshold voltage Vth in erasing.

Note, in FIGS. 2A to 2C, while the example in which the memory transistor including the right control gate 5, one of control gates 5 provided on both sides of the word gate 3, is written, erased and read has been described above, it is possible to program, erase and read the memory transistor including the left control gate 5 by flipping horizontally. The nonvolatile semiconductor memory device shown in FIGS. 2A to 2C can memorize 1-bit in the both sides of the word gate 3 respectively, collectively memorize 2-bit information.

Next, a manufacturing method of the nonvolatile semiconductor memory device according to this exemplary embodiment is described with reference to FIGS. 3A to 3L. FIGS. 3A to 3L are cross-sectional views illustrating a method of manufacturing the nonvolatile semiconductor memory device according to the first embodiment.

Figure 3A:
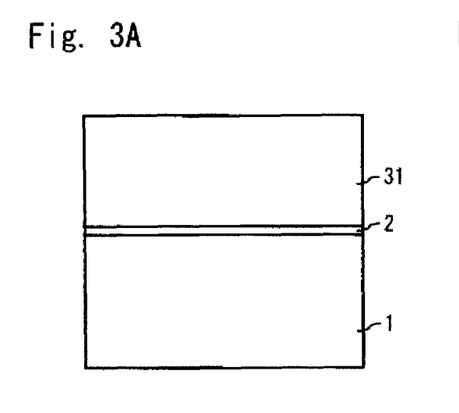
FIGS. 3A to 3L are cross-sectional views illustrating a method of manufacturing the nonvolatile semiconductor memory device according to the first embodiment.

First, the gate insulating film 2 is formed on the surface of the semiconductor substrate 1 by the thermal oxidation. For example, a thermal oxidation film with a thickness of 2 to 4 nm is formed as the gate insulating film 2 by the thermal oxidation with 800 to 900° C. After that, a polysilicon film (a first gate layer) 31 that becomes the word gate 3 is formed on the gate insulating film 2. For example, the polysilicon film 31 with a thickness of 200 to 300 nm is deposited by CVD method or the like. Consequently, the configuration shown in FIG. 3A is obtained.

Figure 3B:
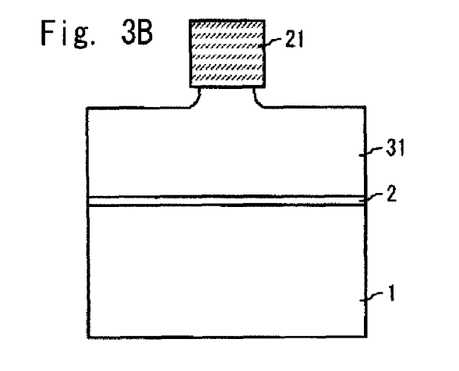

Following this, a resist pattern 21 is formed at a certain region by applying the photo resist on the polysilicon film 31 and performing patterning. Then, patterning of the polysilicon film 31 is performed using the resist pattern 21. In the exemplary embodiment, first, the part of the polysilicon film 31 in thickness direction is etched isotropically, and then rest of the polysilicon film 31 is etched anisotropically.

For example, the isotropic dry etching is performed as the isotropic etching to remove the 20 to 40 nm thick polysilicon film 31. In the isotropic etching, the etching is proceeded in every direction at the same time. Therefore, the etching is proceeded in the film thickness direction and in the direction perpendicular to the thickness (side etch). A gap between the etching surface of the polysilicon film 31 during the etching and the surface of the resist pattern 21 is formed by the side etch. The etching is proceeded to form the gap. As shown in FIG. 3B, the etched end of the polysilicon film 31 is retreated from the pattern end of the resist pattern 21 by the isotropic etching.

Figure 3C:
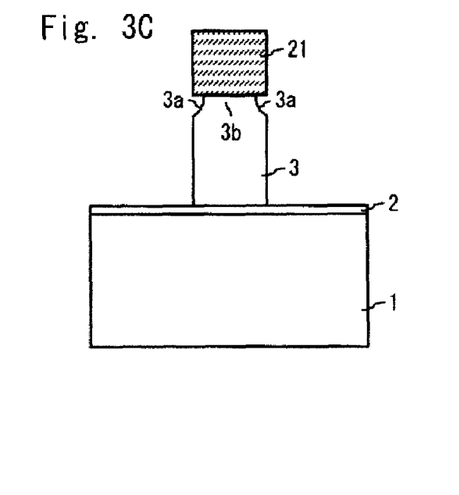

Following that, etching steps are changed, and anisotropic dray etching is performed to the rest of the polysilicon film 31. In the anisotropic etching, the etching is proceeded in the lengthwise direction. Thus, the end of the polysilicon film 31 etched by the anisotropic etching is formed at approximately the same position of the pattern end of the resist pattern 21. If the patterning of the polysilicon film 31 is performed in this way, the word gate 3 is formed in the shape having the projecting part 3b as shown in FIG. 3C. The projecting part 3b is a part which projects in upper direction with a certain width. More specifically, the projecting part 3b and the truncated part 3a are formed by performing the isotropic etching process before the anisotropic etching process. After the patterning of the polysilicon film 31, the resist pattern 21 is removed. Consequently, the word gate 3 is formed above the semiconductor substrate 1 via the gate insulating film 2, the configuration shown in FIG. 3C is obtained.

Note, the isotropic etching and the anisotropic etching can be performed continuously in the same device. For example, if the etching conditions are set to change after the elapse of a certain period of time, the isotropic etching and the anisotropic etching can be performed continuously using one device. The thickness of the polysilicon film 31 etched by the isotropic etching is about 10 to 15% of the overall thickness of the polysilicon film 31.

Figure 3D:
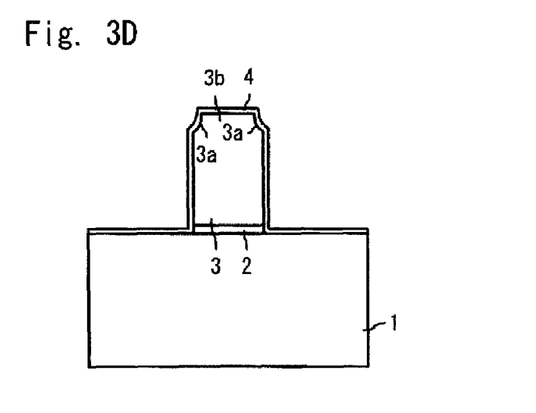

Next, a part of the gate insulating film 2 not covered with the word gate 3 is removed by the wet etching using the formed word gate 3 as a mask. After that, the silicon oxide film, the silicon nitride film and the silicon oxide film are formed in this order to cover the word gate 3. Thus, the ONO film 4 is formed above the semiconductor substrate 1 as shown in FIG. 3D. For example, the silicon oxide film with a film thickness of 6 nm, the silicon nitride film with a film thickness of 10 nm, and the silicon oxide film with a film thickness of 4 nm are sequentially deposited.

Figure 3E:
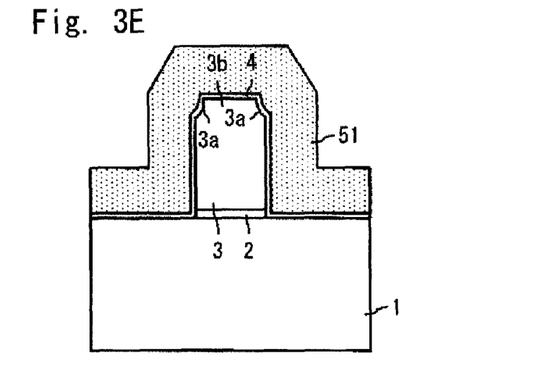

Following that, a polysilicon film (a second gate layer) 51 that becomes the control gate 5 is formed on the ONO film 4. For example, a polysilicon film 51 with a thickness of 90 to 120 nm is formed by the CVD method. Alternatively, an amorphous silicon film to which an impurity such as phosphorus is doped can be foamed instead of the polysilicon film 51. Consequently, the configuration shown in FIG. 3E is obtained.

Figure 3F:
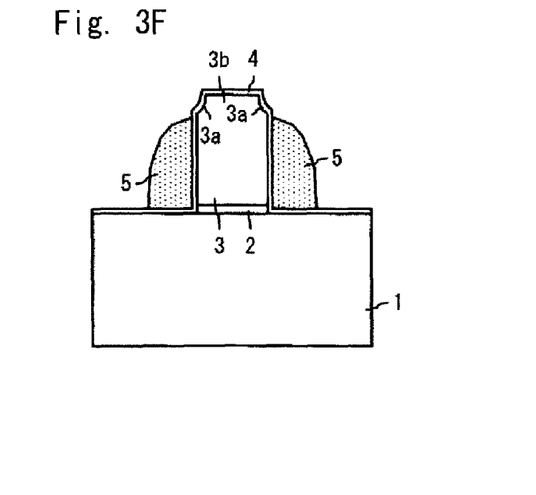

Then, as shown in FIG. 3F, the control gate 5 in the side wall shape is formed by the anisotropic dry etching of the polysilicon film 51. At this time, in this exemplary embodiment, the height of the control gate 5 is lower than the truncated part 3a formed in the word gate 3.

Figure 3G:
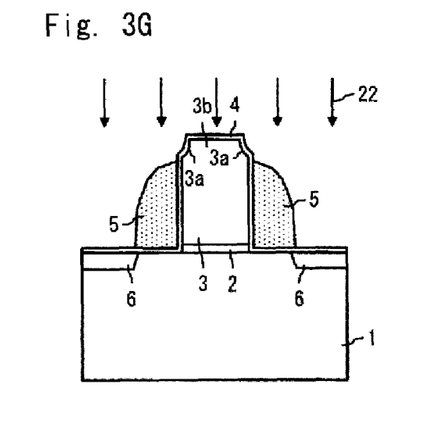

Next, the LDD ion implantation 22 is performed using the control gate 5 and the word gate 3 as a mask. For example, an n-type impurity such as arsenic is injected under the condition that the energy is 10 KeV, and the dose amount is $1E^{13}$ atoms/cm$^2$. Consequently, the LDD region 6 is formed by self-aligning as shown in FIG. 3G.

Figure 3H:
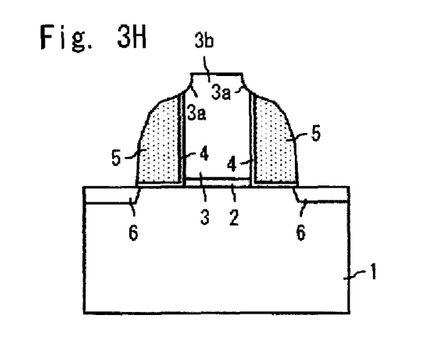

After the LDD ion implantation 22, the ONO film 4 is removed by dry etching using the control gate 5 as a mask. Consequently, the ONO film 4 is removed except the part between the control gate 5 and the word gate 3 and under the control gate 5 as shown in FIG. 3H.

Figure 3I:
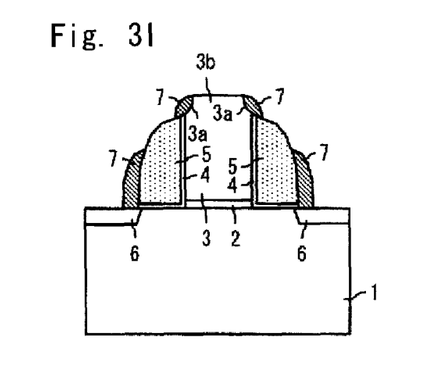

Following that, the insulating film such as oxide film which becomes the side wall 7 is formed to cover the whole surface of the semiconductor substrate 1. For example, the oxide film having about 1000 to 2000 Å thickness is formed by the CVD method. After that, the insulating film is removed by anisotropic dry etching. At this time, in this exemplary embodiment, the insulating film is removed to continuously leave this insulating film in the region from the side surface of the projecting part 3b of the word gate 3 to at least the end of the word gate 3 and to separate this insulating film and the insulating film left on the side of the control gate 5. Consequently, the side wall 7 is formed on the side of the control gate 5 and on the side of the word gate 3 as shown in FIG. 3I.

Note, the side wall 7 on the side of the word gate 3 is preferably extended from the word gate 3 to control gate 5. In other words, it is preferable to perform the etching to continuously leave the insulating film, the side wall 7, on the region from the side of the projecting part 3b to the control gate 5 through the end of the word gate 3 and the ONO film 4.

Figure 3J:
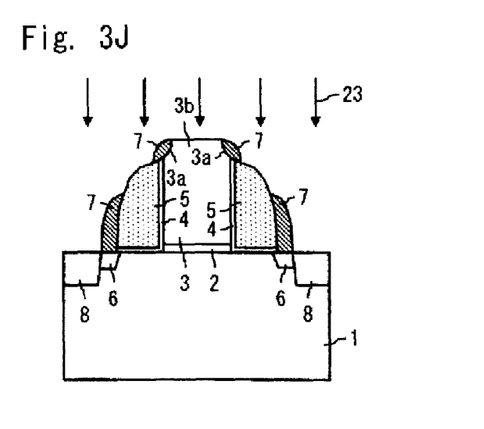

After that, the source/drain ion implantation 23 is performed using the control gate 5, the word gate 3, and the side wall 7 as a mask. For example, an n-type impurity such as arsenic is injected under the condition that the energy is 40 KeV, and the dose amount is $5E^{15}$ atoms/cm$^2$. Consequently, the pair of diffusion layers 8 which become source/drain region are formed by self-aligning as shown in FIG. 3J.

Figure 3K:
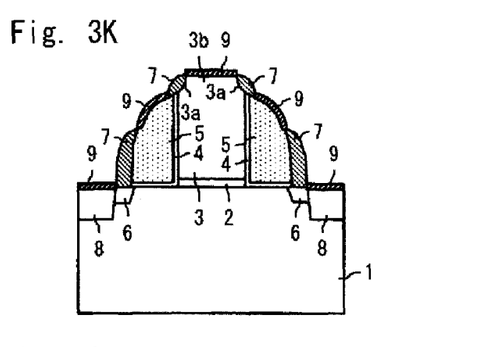

Following that, the metal to be silicided such as titanium or cobalt is deposited on the whole surface of the semiconductor substrate 1, and is annealed by RTA (rapid thermal annealing). The surfaces of the control gate 5, the word gate 3 and the diffusion layer 8 are selectively silicided by RTA to become the silicide layer 9. After that, the non-silicided metal is removed. Thus, the configuration shown in FIG. 3K is obtained.

Figure 3L:
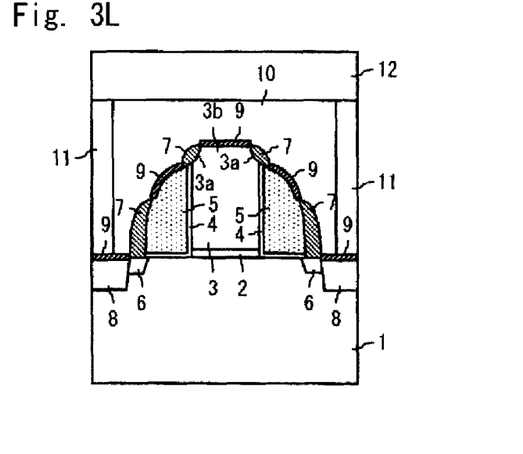

After forming the silicide layer 9, the interlayer insulating film 10 is formed to cover the whole surface of the semiconductor substrate 1. For example, an insulating film such as BPSG is grown as the interlayer insulating film 10. Then, the photo resist coats the interlayer insulating film 10 and the patterning is performed to form the resist pattern. Contact holes are formed in the interlayer insulating film 10 by dry etching using the formed resist pattern as a mask. Then, the metal such as tungsten is buried within a contact hole to form the contact 11. Following that, the conductive layer such as aluminum is formed on the whole surface of the interlayer insulating film 10 and the predetermined patterning is performed. Thus, the wiring 12 is formed as shown in FIG. 3L. After processes described above, the nonvolatile semiconductor memory device according to this exemplary embodiment is completed.

As described above, in this exemplary embodiment, the side wall 7 can be formed on the side of the projecting part 3b and on the word gate 3 which is the outer region of the projecting part 3b by forming the word gate 3 having the projecting part 3b which projects in upper direction with a certain width. Consequently, the width between the silicide layer 9 on the word gate 3 and the silicide layer 9 on the control gate 5 can be increased in the direction in which the word gate 3 and the control gate 5 are neighbored. Thus, the silicide short between them can be prevented without making the difference in height between the word gate and the control gate larger.

Therefore, it is possible to prevent unnecessary impurities from penetrating the control gate 5 and injecting into a channel region during the ion implantation. Further, the interlayer insulating film 10 is not need to be thicker, so the contact 11 can be easily formed relatively. Furthermore, it is possible to prevent the resist mask (resist pattern 21) used during the etching of the word gate 3 from not withstanding the dry etching.

Second Exemplary Embodiment

Figure 4:
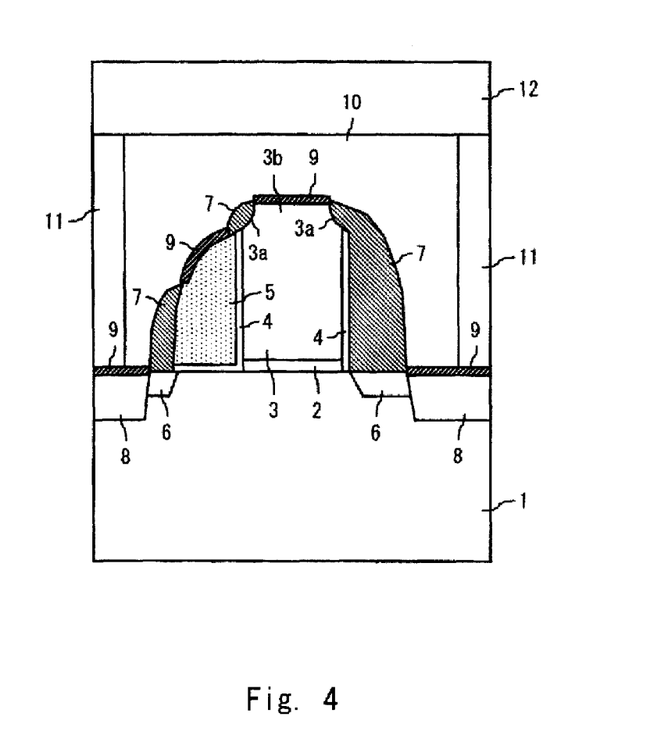
FIG. 4 is a cross-sectional view illustrating a configuration of a nonvolatile semiconductor memory device according to a second exemplary embodiment.

The configuration of a nonvolatile semiconductor memory device according to the second exemplary embodiment is described with reference to FIG. 4. FIG. 4 is a cross-sectional view illustrating a configuration of a nonvolatile semiconductor memory device according to the second exemplary embodiment. While, in the first exemplary embodiment, the present invention has been applied to the nonvolatile semiconductor memory device having the twin MONOS structure, in this exemplary embodiment, the example in which the present invention is applied to the nonvolatile semiconductor memory device having the structure in which the control gate 5 is only provided on one side of the word gate 3 will be described.

In FIG. 4, the word gate 3 which is the same as that in the first exemplary embodiment is formed in this exemplary embodiment. Specifically, the word gate 3 having the projecting part 3b which projects in upper direction with a certain width is formed. In this exemplary embodiment, unlike the first exemplary embodiment, the control gate 5 is not formed on both sides of the word gate 3, but is only formed on one side of that. More specifically, the control gate 5 is arranged on the side of the diffusion layer 8, the source region. The control gate 5 is formed above the channel region of the semiconductor substrate 1 via the ONO film 4 in the side wall shape. The control gate 5 is provided in the same manner as the first exemplary embodiment. The control gate 5 is provided adjacent to the side surface of the word gate 3 lower the projecting part 3b via the ONO film 4. In addition, the ONO film 4 is formed between the word gate 3 and the control gate 5, between the control gate 5 and the semiconductor substrate 1, and on the side surface of the word gate 3 where the control gate 5 is not provided.

The configuration on the side where the control gate 5 is provided is the same as that in the first exemplary embodiment, and the explanation is omitted. Specifically, the side wall 7 is formed on the side of the control gate 5 on the LDD region 6 and on the truncated part 3a. Silicide layers 9 on the word gate 3 and the control gate 5 are separated with side walls 7 interposed therebetween. On the other hand, on the side where the control gate 5 is not provided, the side wall 7 is formed in the side wall shape beside the side surface of the word gate 3 on the LDD region 6 via the ONO film 4. Specifically, the surface of the truncated part 3a and the ONO film 4 is covered with the side wall 7 on the side where the control gate 5 is not provided. Other components are the same as those in FIG. 1, and the explanation is omitted.

As described, a selected transistor which includes the word gate 3 and a memory transistor which includes the control gate 5 are formed in the nonvolatile semiconductor memory device according to the exemplary embodiment.

Figure 5A:
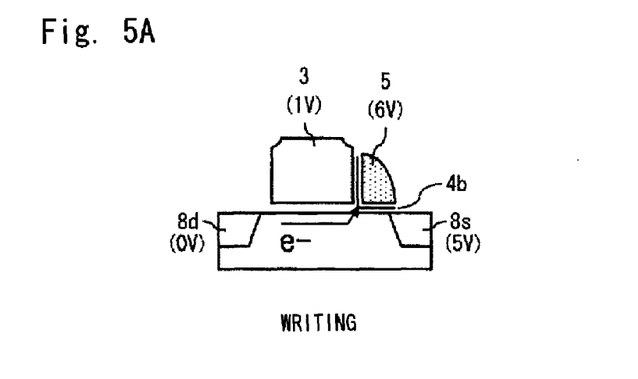
FIGS. 5A to 5C are schematic cross-sectional views illustrating an example of conditions for applying voltages to parts of the nonvolatile semiconductor memory device according to the second exemplary embodiment.
Figure 5B:
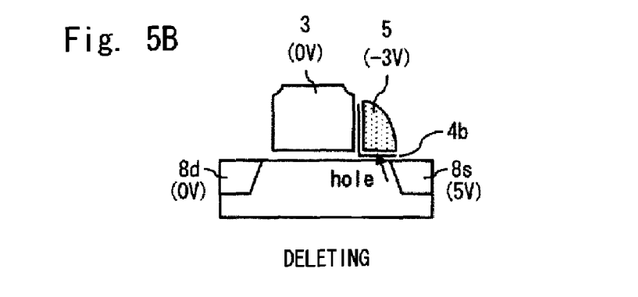
Figure 5C:
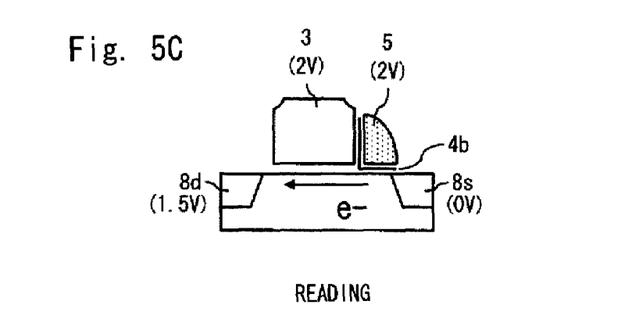

Next, the operation of the nonvolatile semiconductor memory device according to this exemplary embodiment will be described with reference to the FIGS. 5A to 5C. FIGS. 5A to 5C are schematic cross-sectional views illustrating an example of conditions for applying voltages to parts of the nonvolatile semiconductor memory device according to the second exemplary embodiment. FIG. 5A shows a condition for applying voltages in 'programming', FIG. 5B shows that in 'erasing', and FIG. 5C shows that in 'reading', respectively. Note, the conditions for applying voltages shown in FIGS. 5A to 5C are an example, and they are not limited to the above example. The conditions for applying voltages can be modified in various manners as appropriate.

Hereinafter, it is assumed that one diffusion layer 8 of the pair of diffusion layers 8 provided on the side of the control gate 5 is a source region 8s and the other diffusion layer 8 provided on the side where the control gate 5 is not provided is a drain region 8d.

For example, voltages as shown in FIG. 5A are applied to parts of the nonvolatile semiconductor memory device to perform programming. Specifically, for example, 1 V is applied to the word gate 3, 6 V is applied to the control gate 5, 0 V is applied to the drain region 8d, and 5 V is applied to the source region 8s. Consequently, hot electrons are generated in the channel region between the source region 8s and the drain region 8d and hot electrons are locally injected into the region of the silicon nitride film 4b under the control gate 5 on the side of the word gate 3. Injected hot electrons are caught in the trap in the silicon nitride film 4b in the ONO film 4. Accordingly, the threshold voltage Vth of the memory transistor rises.

For example, voltages as shown in FIG. 5B are applied to parts of the nonvolatile semiconductor memory device to perform erasing. Specifically, for example, 0 V is applied to the word gate 3, −3 V is applied to the control gate 5, 0 V is applied to the drain region 8d, and 5 V is applied to the source region 8s. Consequently, holes are injected into the silicon nitride film 4b in the ONO film 4 by generating the holes by BTBT phenomenon and accelerating by the electric field, and the threshold voltage Vth of the memory transistor falls thereby.

For example, voltages as shown in FIG. 5C are applied to parts of the nonvolatile semiconductor memory device to perform reading. Specifically, for example, 2 V is applied to the word gate 3, 2 V is applied to the s control gate 5, 1.5 V is applied to the drain region 8d, and 0 V is applied to the source region 8s. It is possible to distinguish between the written state and the erased state by adjusting the voltage applied to the control gate 5 in reading to be between the threshold voltage Vth in programming and the threshold voltage Vth in erasing. The nonvolatile semiconductor memory device shown in FIGS. 5A to 5C, has 1 bit/cell structure, and can memorize 1-bit information in the control gate 5 provided on one side.

Next, a manufacturing method of the nonvolatile semiconductor memory device according to this exemplary embodiment is described with reference to FIGS. 6A to 6M. FIGS. 6A to 6M are cross-sectional views illustrating a method of manufacturing the nonvolatile semiconductor memory device according to the second embodiment.

First, the gate insulating film 2, the word gate 3, the ONO film 4 and the control gate 5 are formed in the same way in the first exemplary embodiment shown in FIGS. 3A to 3F (6A to 6F). At this stage, control gates 5 are formed on both sides of the word gate 3.

Figure 6A:
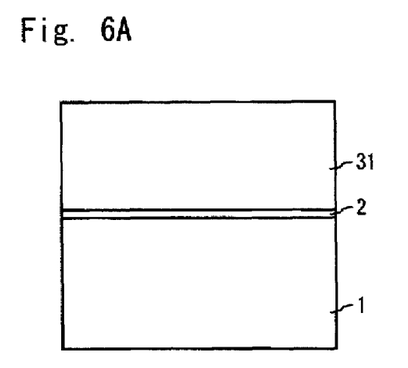
FIGS. 6A to 6M are cross-sectional views illustrating a method of manufacturing the nonvolatile semiconductor memory device according to the second embodiment.
Figure 6B:
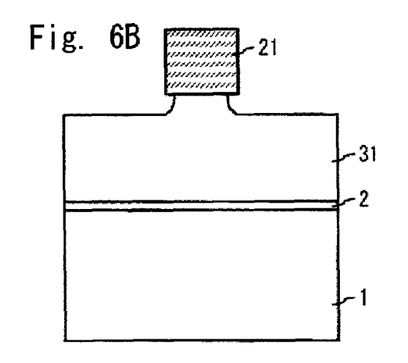
Figure 6C:
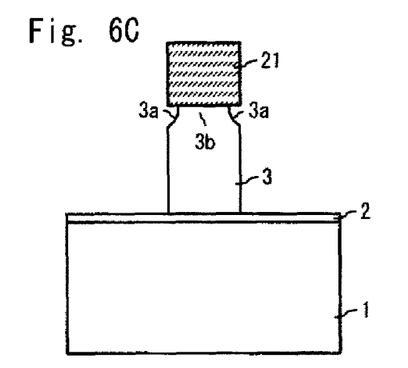
Figure 6D:
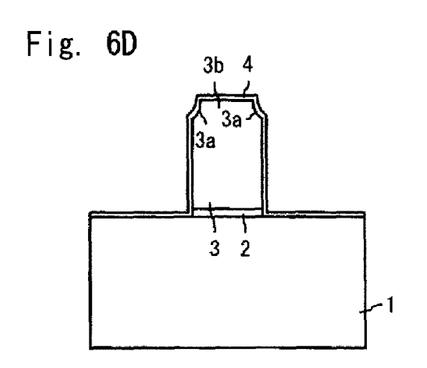
Figure 6E:
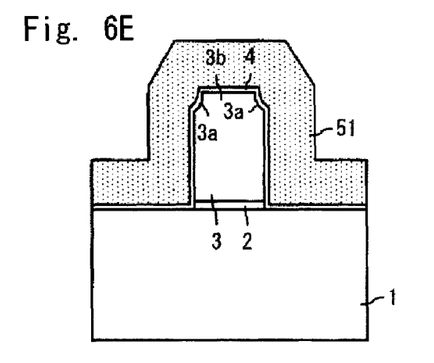
Figure 6F:
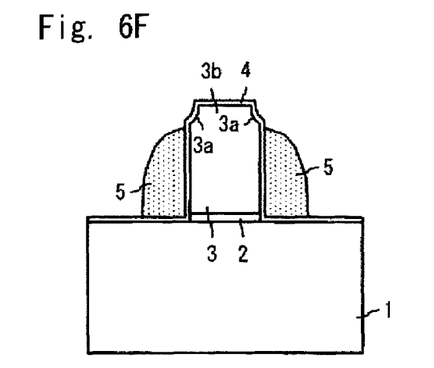
Figure 6G:
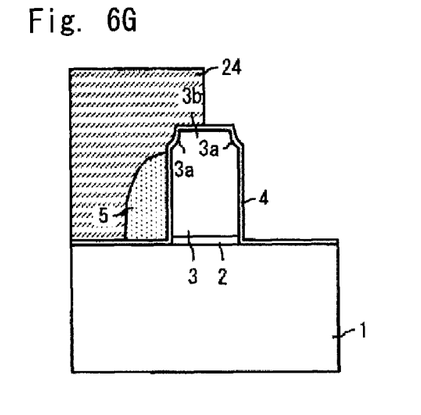

Following that, in this exemplary embodiment, the resist pattern 24 is formed by applying the photo resist on them and performing the patterning. The resist pattern 24 covers one of control gates 5 on both sides of the word gate 3 and does not cover the other control gate 5. One unnecessary control gate 5 is removed by dry etching using the resist pattern 24 as a mask. Consequently, the configuration shown in FIG. 6G is obtained.

Figure 6H:
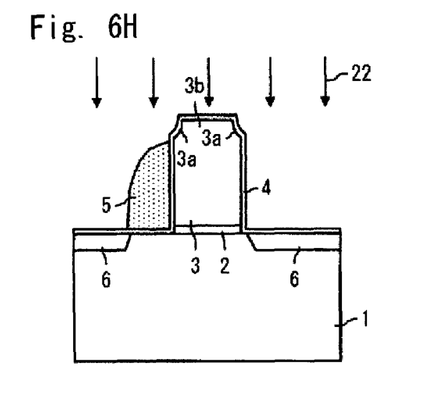

After that, the LDD ion implantation 22 is performed using the control gate 5 and the word gate 3 as a mask. For example, an n-type impurity such as arsenic is injected under the condition that the energy is 10 KeV, and the dose amount is $1E^{13}$ atoms/cm$^2$. Consequently, the LDD region 6 is formed by self-aligning as shown in FIG. 6H.

Figure 6I:
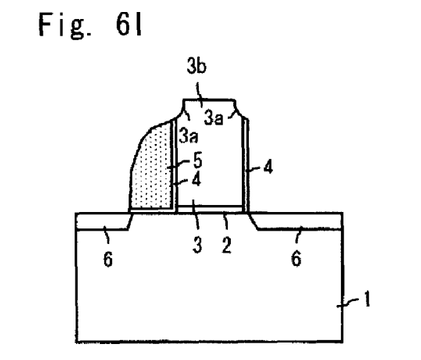

After the LDD ion implantation 22, the ONO film 4 is removed by dry etching using the control gate 5 as a mask. Consequently, the ONO film 4 is removed except the part between the control gate 5 and the word gate 3, under the control gate 5, and on the side surface of the word gate 3 where the control gate 5 is removed as shown in FIG. 6I.

Figure 6J:
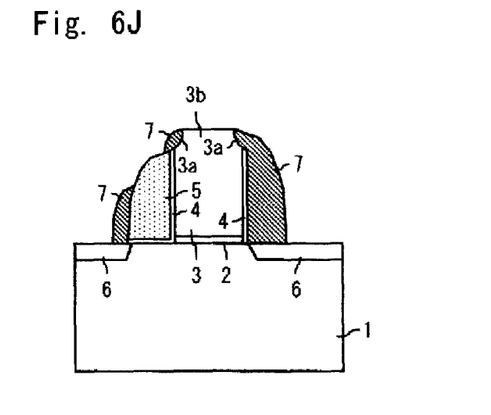

Following that, the insulating film such as oxide film which becomes the side wall 7 is formed to cover the whole surface of the semiconductor substrate 1. For example, the oxide film having about 1000 to 2000 Å thickness is formed by the CVD method. After that, the insulating film is removed by anisotropic dry etching. At this time, in the same way as the first exemplary embodiment, the insulating film is removed to continuously leave this insulating film in the region from the side surface of the projecting part 3b of the word gate 3 to at least the end of the word gate 3 and to separate this insulating film and the insulating film left on the side of the control gate 5. Consequently, the side wall 7 is formed on the side of the control gate 5 and on the side of the word gate 3 as shown in FIG. 6J. In addition, in this exemplary embodiment, the side wall 7 is formed on the side of the word gate 3 where the control gate 5 is not provided.

Figure 6K:
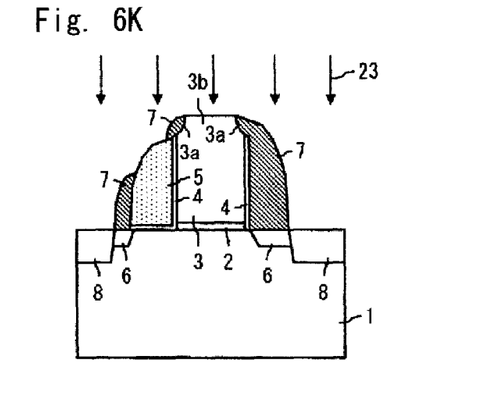
Figure 6L:
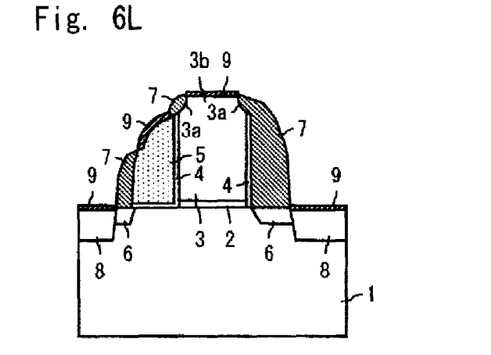
Figure 6M:
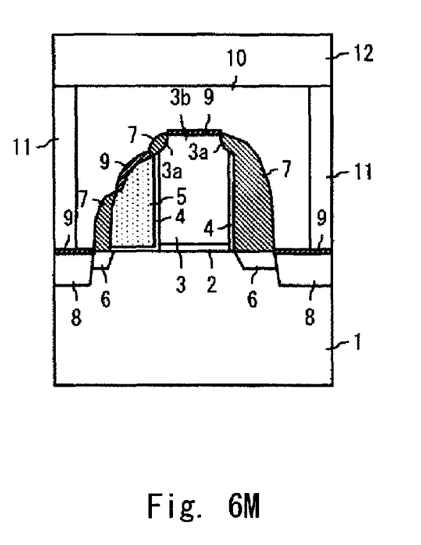

The following processes are the same as the first exemplary embodiment. First, the source/drain ion implantation 23 is performed to form the pair of diffusion layers 8 which become source/drain region by self-aligning as shown in FIG. 6K. Then, the metal to be silicided is deposited on the whole surface of the semiconductor substrate 1, and is treated with heat. After that, the non-silicided metal is removed. Thus, the silicide layer 9 is formed on the surface of the control gate 5, the word gate 3, and the diffusion layer 8 as shown in FIG. 6L. Further, the interlayer insulating film 10 is formed to cover them, and the contact 11 is formed in the interlayer insulating film 10. After that, the wiring 12 is formed. After processes described above, the nonvolatile semiconductor memory device according to this exemplary embodiment shown in FIG. 6M is completed.

As described above, in this exemplary embodiment, it is possible to obtain a similar effect to the first exemplary embodiment by forming the word gate 3 having the projecting part 3b which projects in upper direction with a certain width, even in the structure in which the control gate 5 is only provided on one side of the word gate 3. Consequently, the width between the silicide layer 9 on the word gate 3 and the silicide layer 9 on the control gate 5 can be increased in the direction which the word gate 3 and the control gate 5 are neighbored. Thus, the silicide short between them can be prevented without making the difference in height between the word gate and the control gate larger.

Note, the present invention is not limited to above examples, and it can be modified in various manners as appropriate within the spirit and scope. For example, while the word gate 3 having the projecting part 3b is formed by performing the isotropic etching before the anisotropic in above example, it is not limited to the example. For example, the word gate 3 may be formed by using the different resist patterns between the part of the projecting part 3b and the lower part of the projecting part 3b. However, the method performing the isotropic etching before the anisotropic etching is preferable because the part of the projecting part 3b and the lower part of the projecting part 3b can be performed patterning using one resist pattern 21, and can lead to better productivity.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A nonvolatile semiconductor memory device comprising:
   a first gate electrode formed above a semiconductor substrate via a first insulating film, having a projecting part which projects in upper direction with a certain width;
   a second gate electrode formed beside a side surface of the first gate electrode via a second insulating film;
   a first side walls having insulation properties formed on a side surface of the second gate electrode and a second sidewall having insulation properties formed on a side surface of the projecting part; and
   a silicide layer formed on an upper surface of the projecting part and a part of a surface of the second gate electrode, wherein
   a width of the projecting part is smaller than a width of the first gate electrode below the projecting part,
   wherein the second side wall on the projecting part extends onto the second gate electrode.

2. The nonvolatile semiconductor memory device according to claim 1, wherein the second gate electrode is formed on the side surface of the first gate electrode below the projecting part.

3. The nonvolatile semiconductor memory device according to claim 1, wherein the side wall on the projecting part is continuously formed on a whole of the side surface of the projecting part.

4. The nonvolatile semiconductor memory device according to claim 1, wherein the silicide layer formed on the part of the surface of the second gate electrode is insulated from the silicide layer formed on the upper surface of the projecting part by the second side wall on the projecting part.

5. The nonvolatile semiconductor memory device according to claim 1, wherein the projecting part is gradually expanded from the upper part to the lower part.

* * * * *